United States Patent [19]

Zuhr et al.

[11] Patent Number: 4,908,334
[45] Date of Patent: Mar. 13, 1990

[54] METHOD FOR FORMING METALLIC SILICIDE FILMS ON SILICON SUBSTRATES BY ION BEAM DEPOSITION

[75] Inventors: Raymond A. Zuhr; Orin W. Holland, both of Oak Ridge, Tenn.

[73] Assignee: The United States of America as represented by the United States Department of Energy, Washington, D.C.

[21] Appl. No.: 300,863

[22] Filed: Jan. 24, 1989

[51] Int. Cl.$^4$ ............... H01L 21/24; H01L 21/265; H01L 21/283
[52] U.S. Cl. ............... 437/200; 437/196; 250/492.2
[58] Field of Search ............... 437/196, 200; 250/492.2 R, 492.2 A, 492.21, 492.3

[56] References Cited

U.S. PATENT DOCUMENTS

| | | | |
|---|---|---|---|
| 4,339,869 | 7/1982 | Reihl et al. | 437/26 |
| 4,343,082 | 8/1982 | Lepselter et al. | 437/39 |
| 4,577,396 | 3/1986 | Yamamoto et al. | 437/178 |

FOREIGN PATENT DOCUMENTS

| | | | |
|---|---|---|---|
| 60-226174 | 11/1985 | Japan | 437/200 |
| 63-114122 | 5/1988 | Japan | 437/200 |

OTHER PUBLICATIONS

T. Inada et al., "Layered Structures and Interface Kinetics", Edited by S. Furakawa, KTK Scientific Publishers, Tokyo, 1985, pp. 287–295.

Primary Examiner—Aaron Weisstuch
Attorney, Agent, or Firm—Stephen D. Hamel; Earl L. Larcher; William R. Moser

[57] ABSTRACT

Metallic silicide films are formed on silicon substrates by contacting the substrates with a low-energy ion beam of metal ions while moderately heating the substrate. The heating of the substrate provides for the diffusion of silicon atoms through the film as it is being formed to the surface of the film for interaction with the metal ions as they contact the diffused silicon. The metallic silicide films provided by the present invention are contaminant free, of uniform stoichiometry, large grain size, and exhibit low resistivity values which are of particular usefulness for integrated circuit production.

6 Claims, No Drawings

METHOD FOR FORMING METALLIC SILICIDE FILMS ON SILICON SUBSTRATES BY ION BEAM DEPOSITION

This invention was made as a result of work under contract DE-AC05-840R21400 between Martin Marietta Energy Systems, Inc. and the U.S. Department of Energy.

BACKGROUND OF THE INVENTION

The present invention relates generally to the formation of thin metallic silicide films on silicon substrates, and more particularly to the formation of such films on the surface of heated silicon substrates by ion beam deposition.

Metallic silicides have been found to be useful for providing conducting layers or interconnects in the formation of integrated circuits due to their low resistivity, resistance to electromigration and high thermal stability. Films or very thin coatings of metallic silicides have been particularly useful for providing gates and interconnects in shallow junction technology due to the low sheet resistance of the metallic silicide films.

The primary techniques previously used for preparing thin metallic silicide films on semiconductor substrates include physical vapor deposition procedures practiced by cosputtering with separate metal and silicon targets or by sputtering from a single silicide target have been used to form the films. Metallic silicide films have also been deposited by chemical vapor deposition or by depositing a thin metal film of high purity onto a silicon substrate and then thermally reacting the metal-silicon couple to form the metallic silicide.

These previously known techniques provide for the formation of various metallic silicide films or layers on silicon and other type substrates. However, there are several shortcomings and drawbacks which detract from the usefulness of these previously known metallic silicide-film forming techniques. For example, the purity of the film deposited onto the substrate surface was limited by the purity of the starting materials. Any impurities present in the sputter-targets or the deposition gases were incorporated directly into the film. These impurities resulted in the films having relatively high intrinsic resistivity. Another problem attendant in the practice of the previous techniques is that the films had to be annealed at relatively high temperatures (e.g. about 800° C. for titanium disilicide films) in order to lower the resistivity of the films to acceptable levels. Such annealing of metallic silicide films on silicon substrates containing electronic grade n- or p-type dopants caused considerable dopant diffusion and volatilization which resulted in significant degradation and/or alteration in the properties of the metallic silicide-coated article.

SUMMARY OF THE INVENTION

Accordingly, it is a primary aim or objective of the present invention to provide for the formation of metallic silicide films on silicon substrates in such a manner that the films possess high purity, low resistivity, large grain size, and uniform stoichiometry throughout the film thickness while obviating the problems heretofore present due to diffusion and volatilization of the dopants from the substrate. The films of metallic silicides on silicon substrates as provided by practicing the present invention have low bulk-like resistivity levels and do not require the previously utilized annealing procedures. Generally, the method of the present invention for forming a film of metallic silicide on the surface of a silicon substrate comprises the steps of contacting (irradiating) an exposed surface of a silicon substrate with a beam of metal ions for depositing metal ions on the surface of the substrate.

The metal ions in the beam are at an energy sufficiently low so as essentially negate metal ion loss by sputtering upon contacting the substrate and also sufficiently low so as to limit penetration of the substrate by the metal ions to a depth of less than about 2 nanometers (nm). The energy of the incident ion is sufficiently below the sputter threshold of the substrate material that no loss of substrate atoms occur. The silicon substrate is heated during the contacting thereof with the metal ions to a temperature sufficient to effect diffusion of silicon atoms from the substrate to contact the metal ions as they are being deposited on the surface of the substrate or any portion of the metallic silicide film subsequently formed thereon to essentially athermally interact therewith for continuously forming a film of stoichiometric, metallic silicide on the surface of the silicon substrate. The steps of contacting the surface with metal ions and the heating of the substrate are maintained for a duration sufficient to provide the film of the metallic silicide on the surface of the silicon substrate with a thickness in the range of about 1 to 300 nm.

The ion beam utilized for depositing the metal ions on a surface substrate is at a relatively low level in a range of about 10 to 1000 eV, at a current density in the range of about 1 to about 100 micro-amps/cm$^2$. The temperature to which the substrate is heated during this bombardment with the metal ions is in the range of about 400° to about 600° C. and sufficient for effecting the diffusion of the silicon atoms through the formed portions of the metallic silicide film and to interact with the ions as they contact the surface of the metallic silicide film.

Other and further objects of invention will be obvious upon an understanding of the preferred embodiments and method about to be described or will be indicated in the appended claims, and various advantages not referred to herein will occur to one skilled in the art upon employment of the invention in practice.

DETAILED DESCRIPTION OF THE INVENTION

As generally described above, the present invention is directed to the formation of metallic silicide films of relatively low resistivity values on heated silicon substrates by direct ion beam deposition. The silicide films are produced by the chemical interaction of the metal ions with silicon atoms diffused from the substrate. The ion beam is maintained at a relatively low energy level so as to inhibit losses by sputtering and to prevent the penetration of the ions into the substrate beyond a distance of only a few monolayers. As the metal ions from the ion beam initially accumulate in the near-surface region of the substrate as a continuous metal film, any metallic silicide formation present with the substrate at a temperature in the range of about room temperature to about 300° C. would most likely occur at the film-silicon substrate interface due to the finite range of the ions. This formation of the metallic silicide at the interface of the film and the substrate is due to the energy level of the metal ions contacting the substrate. However, with the deposit of metal ions which interact with the silicon atoms to form metallic silicide layer reaching a depth of about 2 nm, the metallic silicide forming reaction rapidly diminishes due to silicon depletion so that essentially only metal ions are deposited on the metallic silicide layer.

Applicants have discovered that by heating the substrate during the irradiation thereof with the metal ions that diffusion of a sufficient concentration of silicon atoms will occur from the substrate through the substrate-film interface and any formed portions of the metallic silicide film to provide an adequate level of interaction between the silicon atoms and the metal ions to provide a film with stoichiometric properties throughout the entire film thickness. In practicing the present invention the metallic silicide film is formed from the surface or near surface of the substrate outwardly until the desired thickness of the metallic silicide film is achieved.

The mechanism for forming the metallic silicide film by the direct ion deposition onto the heated substrate depends upon both thermal and athermal (ion impact) processes. It is believed that the metallic silicide phases form athermally at the surface of the substrate as a result of ion impact with the ion energy being redistributed among the silicon atoms on the substrate surface in the area contiguous to ion impact to provide the energy necessary to activate the silicide phase formation. To sustain this silicide phase formation the supply of silicon atoms to the surface of the film as it is being formed is maintained by thermal diffusion at elevated temperature.

The silicon substrates may be of any suitable type. For example, single crystal wafers with the $<100>$ axis oriented perpendicular to the surface upon which the ion beam contacts or in any other orientation have been found to be satisfactory. Other silicon crystal structures such as polycrystalline may be use with similar results. Also, the substrates may be doped with n- or p-type dopants for use in selected electronic applications. Further, the substrate may be formed of silicon alloyed with another material such as germanium.

In accordance with the present invention the metallic silicide films are formed for metal-silicon systems in which silicon is the dominant diffusing element, i.e., that is the metal atom is less mobile in the silicide. In the use of ion beam deposition the range of the metal ions in the silicides is less than two nm for all anticipated energy-ion combinations, so that any movement of the reactants necessary for forming the metallic silicide films must be made by diffusion. Thus, in accordance with the present method, with the silicon being the dominant diffuser, the silicon atoms diffuse from the substrate through the growing metallic silicide film to the near surface region of the film where they athermally interact with the incident energetic metal ions to form metallic silicides.

The ion beam energies utilized in practicing the present invention are in the range of about 10 to 1000 eV with current densities in the range of about 1 to about 10 micro-amps/cm$^2$. The ion beams within this energy range are sufficient for forming metal silicide films of a thickness in the range of about 1 to 300 nm. The use of these relatively low ion beam energies is sufficient to effect the athermal formation of a metallic silicide on the surface of the silicon substrate and any previously formed portion of the metallic silicide film layer without causing undesirable ion implantation below the near surface regions of the substrate. As pointed out above, with these low beam energies the metal ions only penetrate a few monolayers into the substrate so that essentially all reactions incident to the metallic silicide film formation are essentially surface reactions. Since the penetration depth of the ions into the substrate is small, as required for a surface technique, then at the relatively low temperatures used herein, the reaction will stop after the silicide grows sufficiently thick (in the order several monolayers) to isolate the silicon substrate from the newly arriving atoms.

In order to provide the silicon atoms necessary for forming the stoichiometric metallic silicide films the substrate is heated to a temperature which is sufficient to effect diffusion of an adequate number of silicon atoms through the silicide film as it is being formed to interact with the metal ions at the surface of the growing metallic silicide film. It has been found that for the formation of stoichiometric metallic silicide films with a thickness in the aforementioned range that heating the silicon substrate to the temperature in the range of about 400° to 600° C. is required. With the substrate heated to temperatures less then about 400° C. it is believed that there will be an insufficient concentration of silicon atoms to produce a uniformly stoichiometric silicide throughout the film thickness. Also, with temperatures greater than about 600° C. no beneficial increase in the diffusion of silicon atoms is realized and deleterious diffusion and/or volatilization of the dopants from the substrate starts to occur and increases with increasing temperature. The maximum temperature utilized for practicing the present invention is at least about 100° C. less than that required for practicing the physical and chemical deposition technique previously utilized and is at least 200° C. less than that required for the annealing procedures heretofore required to reduce the resistivity of the metallic silicide to the desired value.

The various metals which are usable for forming the beam of metal ions in the present invention are those metals which, as noted above, are slower diffusers or less mobile in metallic silicides than the silicon atoms. These metals include titanium, tungsten, iron, vanadium, tantalum, and molybdenum. Of these various metals, titanium is believed to be the most desirable for many electronic applications since the titanium disilicide formed from practicing present invention has the lowest resistivity values.

Prior to providing the silicon substrate with the metallic silicide film, it may be preferable to clean the surface of the substrate. Satisfactory cleaning can be provided by rinsing the substrate in ethanol, distilled water, and dilute HF prior to mounting the substrate in the vacuum chamber utilized for the ion beam deposition. The surfaces of the substrates can also be cleaned while in the vacuum chamber immediately before initiating the ion beam deposition by bombarding the substrate with a low-energy beam of chlorine ions at a dose of about $1 \times 10^{17}$/cm$^2$ while the substrate is heated to temperature of about 500° C. This ion beam cleaning procedure is similar to reactive ion etching and provides surfaces which are conducive to good epitaxilial growth on silicon.

The ion beam deposition may be carried out in a suitable chamber or deposition chamber evacuated to a pressure in the range of about $1 \times 10^{-7}$ to $1 \times 10^{-10}$ torr. The ion beam deposition and the heating of the substrate is maintained until the metallic silicide film reaches the desired thickness. Normally, with ion beam energies in the aforementioned range a metallic silicide film growth rate in the order of about 1 nm/min is provided. With such a growth rate a reaction duration of about 1 minute to about 5 hours would be required for forming a metallic silicide film with a thickness in the range of about 1 to 300 nm.

In order to provide a more facile understanding of the present invention several examples relating to the formation of metallic silicide films on silicon substrates using different metal ions are set forth below. In these examples the silicon substrates are single crystal wafers with the <100> axis oriented perpendicularly to the surface contacted by the ion beam. All substrates used were electronic grade n- or p-type Si doped respectively with P and B to resistivities of 5 to 10 ohms-cm. The particular concentration and/or type of dopants is not critical to the formation of high purity metallic silicide films since the temperatures employed are insufficient to cause any deleterious diffusion of the dopants from the substrate.

In the following examples the metallic silicide films were produced by the direct deposition of low energy (40 to 200 eV) metal ions onto the silicon substrates. The metal ion beam was produced at the minimum extraction energy of 35 keV in a commercially available ion implantation accelerator (Extrion 200-1000) using a Freeman ion source. In these examples the 35 keV beam was magnetically mass analyzed and passed through three stages of liquid-nitrogen trapped differential pumping and a seven-degree neutral trap. The beam entering the deposition chamber was decelerated in a four-element deceleration lens system to the desired final energy. The pressure in the deposition chamber was in the $10 \times 10^{-10}$ torr range. The silicon substrates were each held in a 14 mm diameter holder containing a resistance heater capable of heating the substrate surface to a temperature of about 900° C. A Faraday cup was used for positioning and laterally profiling the beam. The films produced were characterized by conventional Rutherford backscattering and ion channelling with 2-MeV He at a scattering angle of 160 degrees to measure stoichiometry of the metallic silicide films, film thickness and degree of epitaxy. Details on the micro structure of the metallic silicide films were obtained by transmission electron microscopy of cross-sectionally thinned specimens by using a commercially available Philips EM400T transmission electron microscope operating at 100 keV. Sheet resistance measurements were made with a standard 4-point probe and were converted to electrical resistivities using the film thicknesses determined from the Rutherford backscattering measurements.

EXAMPLE 1

A cleaned, single-crystal silicon wafer was mounted in the ion beam deposition chamber and subjected to a beam of titanium ions at a energy of 100 eV. During this ion bombardment the substrate was heated to 550° C. A film of titanium disilicide was formed on the surface of the wafer in a deposit area of approximately 3 cm² at a growth rate of about 1 nm/min. The film growth was continued to a thickness of 200 nm and when analyzed exhibited low bulk-like resistivity of 15–20 micro-ohms-cm This resistivity value compares favorably to the 13–25 micro-ohms-cm values for thin titanium disilicide films formed by using previously known techniques and annealed at temperatures in excess of 800° C.

EXAMPLE 2

A 55-nm thick polycrystalline film of tungsten disilicide film was formed on a single-crystal silicon wafer heated to a temperature of 500° C. with an incident ion beam energy of 200 eV. The growth rate of the film was similar to that of the titanium. The uniform height of scattering from both the tungsten and the silicon in the film as provided by a 2-MeV He ion backscattering spectrum indicated that a constant ratio of silicon to tungsten was present throughout the thickness of the film while the relative heights of the two regions indicated that the ratio of silicon to tungsten was 2 to 1 or stoichiometric throughout the thickness of the film. The large lattice mismatch for this tungsten disilicide film prevented epitaxial growth during the film formation.

EXAMPLE 3

An iron disilicide film was formed on a single crystal silicon wafer at an ion beam energy of 40 eV while the substrate was heated to 550° C. The film growth rate was approximately 1 nm/min. Analysis of the 200 nm-thick film indicated that the film was of uniform stoichiometry throughout the thickness of the film with the ratio of silicon to iron being 2, which is iron disilicide. The resistivity measurement of this film was approximately 850 ohms-cm, which compares favorably with resistivity values previously achieved for iron disilicide films sintered at temperatures greater than 700° C.

It will be seen that the metallic silicide films formed by practicing the method of the present invention possess resistivities which are comparable to the lowest values achieved by practicing any of the previously known techniques and which are achieved at temperatures significantly lower than heretofore usable so as to significantly reduce the thermal budget and greatly reduce the redistribution and/or volatilization of dopants. The ion beam deposition of the present invention can be accomplished with a magnetically analyzed beam that is elementally and isotopically pure so as to provide metallic silicide films of high purity without oxygen or nitrogen contaminants and which are homogeneous and uniformly stoichiometric with relatively large grains.

We claim:

1. A method for forming a film of metallic silicide of essentially uniform stoichiometry on the surface of a silicon substrate, comprising the steps of contacting an exposed surface of a silicon substrate with a beam of metal ions for depositing metal ions on the surface of the substrate, with said ions being at an energy level sufficiently low to substantially minimize metal ion loss by sputtering upon said contact and to effect penetration by said metal ions into the surface of the silicon substrate to a maximum depth of less than about 2 nm, heating the silicon substrate during the contacting thereof with the beam of metal ions to a temperature sufficient to effect diffusion of silicon atoms from said substrate to contact the metal ions as they are being deposited on said surface to essentially athermally interact therewith for continuously forming a film of metallic silicide on the surface of said silicon substrate, and maintaining said contacting of said surface with said metal ions and said heating of the substrate to continue the diffusion of silicon atoms through formed portions of said film and thereby continue the metallic-silicide forming interaction for a duration sufficient to provide said film of the metallic silicide on the surface of the silicon substrate with a thickness in the range of about 1 to 300 nm.

2. The method claimed in claim 1, wherein said metal ion beam is at an energy level in the range of about 10 to 1000 eV at a current density in the range of about 1 to 100 micro-amps/cm$^2$.

3. The method claimed in claim 1 wherein said temperature is in the range of about 400° to about 600° C.

4. The method claimed in claim 1, wherein the metal providing said metal ions is characterized by being less mobile than the silicon atoms in the metallic silicide film during the formation thereof.

5. The method claimed in claim 4, wherein the metal providing the metal ions is selected from titanium, iron, tungsten, molybdenum, tantalum and vanadiums.

6. The method claimed in claim 1, wherein the metal forming the metal ions is titanium, wherein the energy level is in the range of about 100 to 200 eV, wherein the substrate is heated to a temperature in the range of about 450° to 500° C., and wherein the metallic silicide film formed by the interaction of the titanium ions and silicon atoms on the surface of the substrate is titanium disilicide.

* * * * *